United States Patent
Frolov et al.

(10) Patent No.: US 10,892,591 B2
(45) Date of Patent: Jan. 12, 2021

(54) HIGH SPEED DRIVER FOR PARTICLE BEAM DEFLECTOR

(71) Applicant: Fermi Research Alliance, LLC, Batavia, IL (US)

(72) Inventors: Daniil Frolov, Aurora, IL (US); Gregory Saewert, Aurora, IL (US)

(73) Assignee: FERMI RESEARCH ALLIANCE, LLC, Batavia, IL (US)

( * ) Notice: Subject to any disclaimer, the term of this patent is extended or adjusted under 35 U.S.C. 154(b) by 0 days.

(21) Appl. No.: 16/373,367

(22) Filed: Apr. 2, 2019

(65) Prior Publication Data
US 2019/0305502 A1 Oct. 3, 2019

Related U.S. Application Data

(60) Provisional application No. 62/651,892, filed on Apr. 3, 2018.

(51) Int. Cl.
*H01S 3/00* (2006.01)
*H01S 3/094* (2006.01)
*G02B 27/10* (2006.01)
*H03K 3/01* (2006.01)

(52) U.S. Cl.
CPC .......... *H01S 3/0085* (2013.01); *G02B 27/106* (2013.01); *H01S 3/094076* (2013.01); *H03K 3/01* (2013.01)

(58) Field of Classification Search
CPC .. H03K 17/691; H03K 17/102; H03K 17/107; H03K 17/6871; H03K 17/785; H03K 17/284; H03K 17/601
See application file for complete search history.

(56) References Cited

U.S. PATENT DOCUMENTS

| | | | | |
|---|---|---|---|---|
| 3,910,679 A | * | 10/1975 | Rushworth | G02F 1/0327 359/264 |
| 4,503,480 A | | 3/1985 | Pickard et al. | |
| 4,577,166 A | * | 3/1986 | Milberger | H03K 17/691 307/106 |
| 4,841,528 A | * | 6/1989 | Sipes, Jr. | H01S 3/1075 372/11 |
| 5,016,251 A | * | 5/1991 | D'Arcy | H01S 3/115 372/10 |

(Continued)

FOREIGN PATENT DOCUMENTS

DE RU-2524049 A1 3/1988

OTHER PUBLICATIONS

"A Fast 650V Chopper Diver" (Paoluzzi, M. M., 2nd International Particle Accelerator Conference, San Sebastian, Spain, Sep. 4-9, 2011, pp. TUPS101).

(Continued)

*Primary Examiner* — Thomas J. Hiltunen
(74) *Attorney, Agent, or Firm* — Loza & Loza LLP; Kevin L. Soules

(57) ABSTRACT

A system, method and apparatus for providing pulsed power comprises a trigger comprising a pulse generator and a photonic transmitter and a multi-stage switch comprising a gate driver circuit, the gate driver circuit further comprising a plurality of transistors connected in series and a plurality of driver stages wherein each of the transistors is turned on and off simultaneously by the plurality of driver stages.

15 Claims, 13 Drawing Sheets

(56) References Cited

U.S. PATENT DOCUMENTS

| | | | | |
|---|---|---|---|---|
| 5,280,382 | A * | 1/1994 | Osterwalder | H03K 17/78 327/181 |
| 5,594,378 | A * | 1/1997 | Kruse | H03K 17/102 307/106 |
| 5,966,425 | A * | 10/1999 | Beland | H02M 7/1557 378/108 |
| 6,900,557 | B1 * | 5/2005 | Gaudreau | H02M 1/088 307/113 |
| 8,395,284 | B2 * | 3/2013 | Schurack | H03K 17/0822 307/106 |
| 8,536,929 | B2 | 9/2013 | Bergmann | |
| 8,563,930 | B2 * | 10/2013 | Harris | H03C 1/34 250/338.1 |
| 8,610,990 | B2 | 12/2013 | Bergmann | |
| 9,048,119 | B2 * | 6/2015 | Kanazawa | H01L 27/0883 |
| 9,287,863 | B2 * | 3/2016 | Wang | H03K 17/16 |
| 9,548,664 | B2 * | 1/2017 | Yabumoto | H02M 1/08 |
| 9,787,218 | B2 * | 10/2017 | Yamagishi | H03K 4/023 |
| 9,887,697 | B2 * | 2/2018 | Lee | H03K 17/691 |
| 9,893,679 | B2 * | 2/2018 | Sampayan | H03C 7/025 |
| 9,935,218 | B2 * | 4/2018 | Kozyrev | H01L 31/03044 |
| 10,014,856 | B2 * | 7/2018 | Uchida | H04L 25/0266 |
| 10,205,447 | B1 * | 2/2019 | Ribarich | H03K 17/691 |
| 2004/0041201 | A1 | 3/2004 | Sugiyama et al. | |
| 2004/0125617 | A1 * | 7/2004 | Lin | H02M 1/092 363/16 |
| 2005/0194919 | A1 | 9/2005 | Xavier et al. | |
| 2005/0224909 | A1 | 10/2005 | Yamaguchi et al. | |
| 2013/0271187 | A1 * | 10/2013 | Hayashi | H03K 17/16 327/109 |
| 2014/0167725 | A1 | 6/2014 | Yang et al. | |
| 2019/0305689 | A1 * | 10/2019 | Ando | H01F 19/00 |

OTHER PUBLICATIONS

"A fast chopper for medium energy beams" (R. Madrak and D. Wildman, Journal of Instrumentation,—vol. 9.—2014).

* cited by examiner

HIGH SPEED DRIVER FOR PARTICLE BEAM DEFLECTOR

CROSS REFERENCE TO RELATED PATENT APPLICATIONS

This patent application claims the priority and benefit under 35 U.S.C. § 119(e) of U.S. Provisional Patent Application Ser. No. 62/651,892 filed Apr. 3, 2018, entitled "HIGH SPEED DRIVER FOR PARTICLE BEAM DEFLECTOR." U.S. Provisional Patent Application Ser. No. 62/651,892 is herein incorporated by reference in its entirety.

STATEMENT OF GOVERNMENT RIGHTS

The invention described in this patent application was made with Government support under the Fermi Research Alliance, LLC, Contract Number DE-AC02-07CH11359 awarded by the U.S. Department of Energy. The Government has certain rights in the invention.

TECHNICAL FIELD

Embodiments are generally related to the field of pulsed power technologies. Embodiments are further related to pulsed power applications including, but not limited to, switching power supplies, power modulators, wireless power transmission, power conversion, and particle accelerators. Embodiments are further related to methods and systems for particle beam deflectors. Embodiments are additionally related to drivers for particle beam deflectors.

BACKGROUND

Certain beam deflector technologies, specifically those associated with particle accelerators, require power supplies. Circuits can be used to modulate such power supplies. For example, certain circuits are used for operating travelling wave kickers which are used in particle accelerators for giving a kick to a selected bunch in a particle beam. Such devices often require the delivery of high voltage waveforms with fast rise/fall time, often to low impedance structures. Different techniques to generate fast high voltage pulses can presently be implemented using commercially available semiconductor devices.

Recent developments in superconducting accelerator technologies have resulted in the ability to build linear accelerators capable of operating in continuous wave (CW) mode. Therefore, modern beam deflecting devices (among other components of such linear accelerators) that can also operate at CW mode are desirable. For example, the PIP-II Injector test superconducting linear accelerator at FermiLab has operational requirements that include a kicker driver configured to have an absolute worst case 4 ns rise/fall time, 500 V amplitude, ability to switch at about 81.25 MHz in 100 ns bursts and handle average switching rates of more than 30 MHz for the CW operation. There is presently no driver capable of meeting these criteria.

Accordingly, there is a need in the art for high speed drivers for particle beam deflectors as disclosed herein.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide a method and system for beam deflection.

It is another aspect of the disclosed embodiments to provide a method and system for beam deflection associated with particle accelerators.

It is another aspect of the disclosed embodiments to provide methods, systems, and apparatuses for improved high-speed drivers for beam deflectors used with particle accelerators.

The aforementioned aspects and other objectives and advantages can now be achieved as described herein. In an embodiment, a driver system and apparatus can comprise a trigger, the trigger comprising a pulse generator and a trigger generator, and a multi-stage switch comprising a plurality of stages connected in series, each of the stages comprising a transistor, and a driver for each transistor, wherein each of the transistors is turned on and off simultaneously by the associated driver.

In an embodiment, the trigger generator comprises a photonic transmitter, the photonic transmitter further comprising: a laser, an electro-optical modulator, and an optical splitter. In an embodiment, the system and apparatus further comprises a plurality of photonic receivers wherein each output of the optical splitter is received by one of the plurality of the receivers. In an embodiment, the trigger generator accepts an input pulse pattern, splits the input pulse pattern, and provides two modified pulse patterns to each of the stages.

In an embodiment, the system and apparatus further comprises an SR latch wherein one of the two modified pulse patterns is input to a set of the SR latch, and one of the two modified pulse patters is input to a reset of the SR latch.

In an embodiment, the system and apparatus further comprises an isolated AC power source connected to each of the plurality of stages. In an embodiment, the system and apparatus further comprises a load wherein the multi-stage switch provides a voltage to the load.

In another embodiment, a method for generating a pulse comprises providing a pulse pattern as input a trigger generator, splitting the pulse pattern into a plurality of pulses, delivering one of the plurality pulses to each stage in a multi-stage switch, and driving a transistor associated with each stage with the plurality of pulses wherein the transistors associated with each stage are turned on and off simultaneously. The method can further comprise providing laser light from a laser associated with the trigger generator and modulating the laser light with the pulse pattern. The method can further comprise isolating each stage in the multistage switch. The method can further comprise receiving input at each of the stages with a photo detector. In another embodiment the system further comprises adjusting a turn-on delay time and a turn-off delay time for each stage in the multistage switch.

BRIEF DESCRIPTION OF THE FIGURES

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Figure 1:
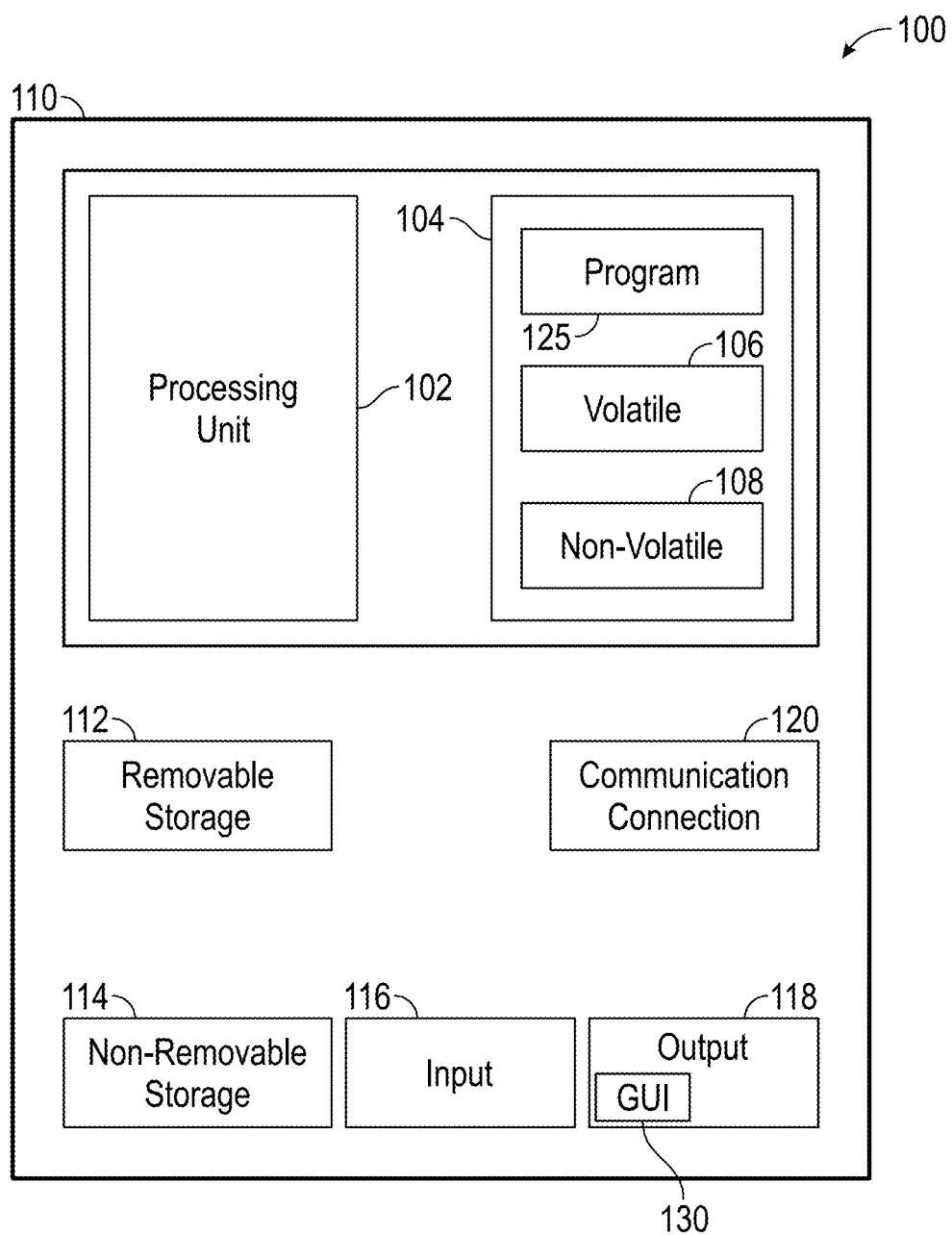
FIG. 1 depicts a block diagram of a computer system which is implemented in accordance with the disclosed embodiments.

The particular values and configurations discussed in the following non-limiting examples can be varied, and are cited merely to illustrate one or more embodiments and are not intended to limit the scope thereof.

Example embodiments will now be described more fully hereinafter with reference to the accompanying drawings, in which illustrative embodiments are shown. The embodiments disclosed herein can be embodied in many different forms and should not be construed as limited to the embodiments set forth herein; rather, these embodiments are provided so that this disclosure will be thorough and complete, and will fully convey the scope of the embodiments to those skilled in the art. Like numbers refer to like elements throughout.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

Figure 2:
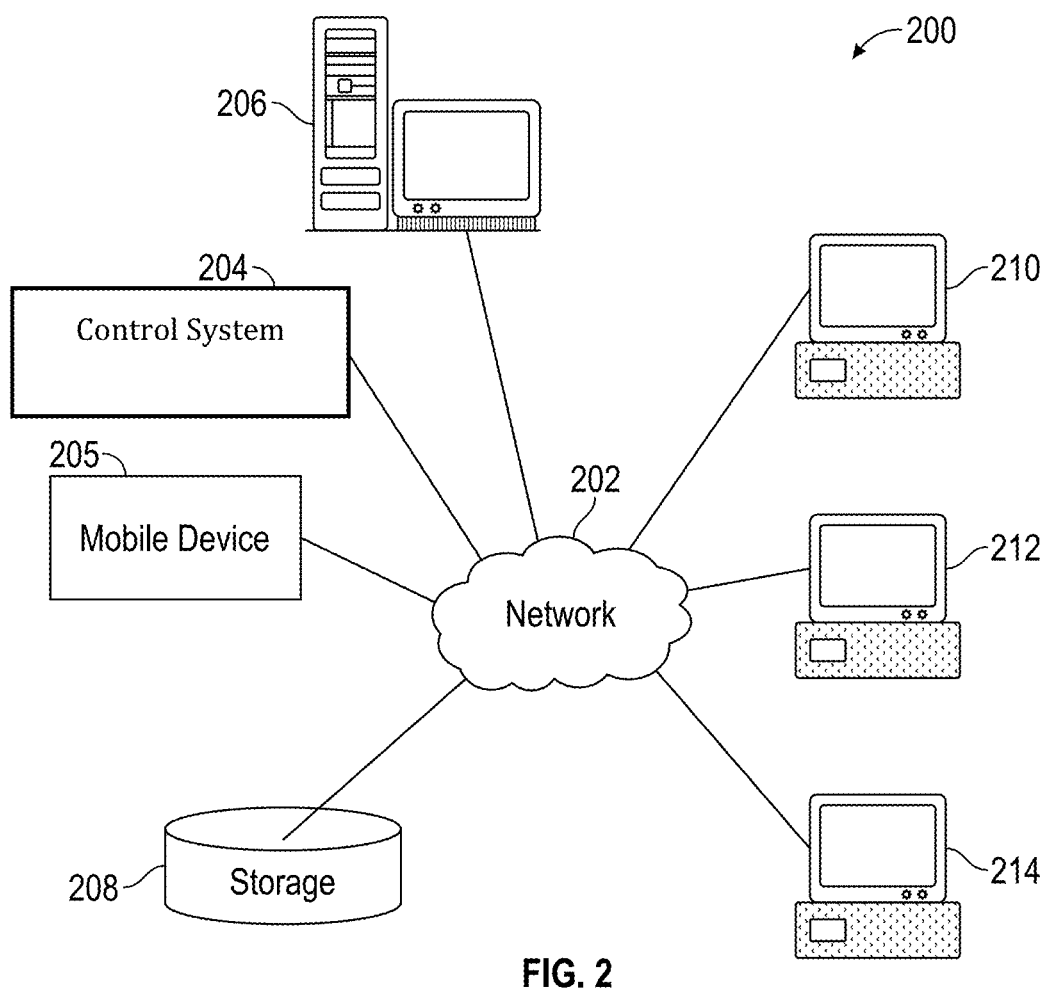
FIG. 2 depicts a graphical representation of a network of data-processing devices in which aspects of the present embodiments may be implemented.
Figure 3:
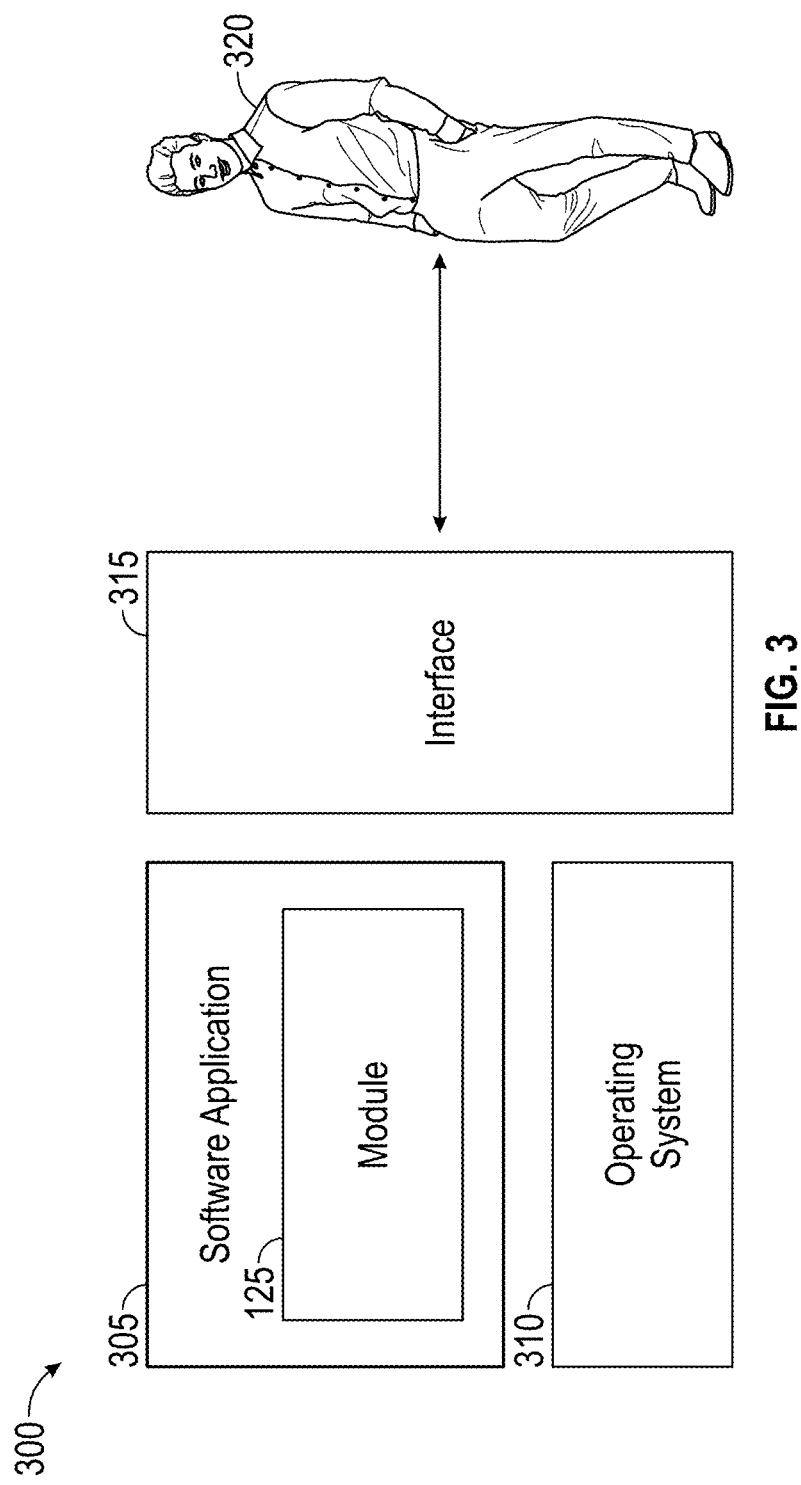
FIG. 3 depicts a computer software system for directing the operation of the data-processing system depicted in FIG. 1, in accordance with an example embodiment.

FIGS. 1-3 are provided as exemplary diagrams of data-processing environments in which embodiments of the present invention may be implemented. It should be appreciated that FIGS. 1-3 are only exemplary and are not intended to assert or imply any limitation with regard to the environments in which aspects or embodiments of the disclosed embodiments may be implemented. Many modifications to the depicted environments may be made without departing from the spirit and scope of the disclosed embodiments.

A block diagram of a computer system 100 that executes programming for implementing the methods and systems disclosed herein is shown in FIG. 1. A general computing device in the form of a computer 110 may include a processing unit 102, memory 104, removable storage 112, and non-removable storage 114. Memory 104 may include volatile memory 106 and non-volatile memory 108. Computer 110 may include or have access to a computing environment that includes a variety of transitory and non-transitory computer-readable media such as volatile memory 106 and non-volatile memory 108, removable storage 112 and non-removable storage 114. Computer storage includes, for example, random access memory (RAM), read only memory (ROM), erasable programmable read-only memory (EPROM) and electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage, or other magnetic storage devices, or any other medium capable of storing computer-readable instructions as well as data, including data comprising frames of video.

Computer 110 may include or have access to a computing environment that includes input 116, output 118, and a communication connection 120. The computer may operate in a networked environment using a communication connection to connect to one or more remote computers or devices. The remote computer may include a personal computer (PC), server, router, network PC, a peer device or other common network node, or the like. The remote device may include a sensor, photographic camera, video camera, tracking device, or the like. The communication connection may include a Local Area Network (LAN), a Wide Area Network (WAN), or other networks. This functionality is described in more fully in the description associated with FIG. 2 below.

Output 118 is most commonly provided as a computer monitor, but may include any computer output device. Output 118 may also include a data collection apparatus associated with computer system 100. In addition, input 116, which commonly includes a computer keyboard and/or pointing device such as a computer mouse, computer track pad, or the like, allows a user to select and instruct computer system 100. A user interface can be provided using output 118 and input 116. Output 118 may function as a display for displaying data and information for a user and for interactively displaying a graphical user interface (GUI) 130.

Note that the term "GUI" generally refers to a type of environment that represents programs, files, options, and so forth by means of graphically displayed icons, menus, and dialog boxes on a computer monitor screen. A user can interact with the GUI to select and activate such options by directly touching the screen and/or pointing and clicking with a user input device 116 such as, for example, a pointing device such as a mouse, and/or with a keyboard. A particular item can function in the same manner to the user in all applications because the GUI provides standard software routines (e.g., module 125) to handle these elements and report the user's actions. The GUI can further be used to display the electronic service image frames as discussed below.

Computer-readable instructions, for example, program module 125, which can be representative of other modules described herein, are stored on a computer-readable medium and are executable by the processing unit 102 of computer 110. Program module 125 may include a computer application. A hard drive, CD-ROM, RAM, Flash Memory, and a USB drive are just some examples of articles including a computer-readable medium.

FIG. 2 depicts a graphical representation of a network of data-processing systems 200 in which aspects of the present invention may be implemented. Network data-processing system 200 is a network of computers in which embodiments of the present invention may be implemented. Note that the system 200 can be implemented in the context of a software module such as program module 125. The system 200 includes a network 202 in communication with one or more clients 210, 212, and 214. Network 202 is a medium that can be used to provide communications links between various devices and computers connected together within a networked data processing system such as computer system 100. Network 202 may include connections such as wired communication links, wireless communication links, or fiber optic cables. Network 202 can further communicate with one or more servers 206, one or more external devices such as a printer, copier, scanner, fax machine, multi-function device, multi-function printer, sensor, detector, manufacturing device, additive manufacturing device, EBM device, control device, control system, or the like 204, a mobile device 205, and a memory storage unit such as, for example, memory or database 208.

In the depicted example, control device 204 and server 206 connect to network 202 along with storage unit 208. In addition, clients 210, 212, and 214 connect to network 202. These clients 210, 212, and 214 may be, for example, personal computers or network computers. Computer system 100 depicted in FIG. 1 can be, for example, a client such as client 210, 212, and/or 214. Alternatively, clients 210, 212, and 214 may also be, for example, a photographic camera, video camera, tracking device, sensor, etc.

Computer system 100 can also be implemented as a server such as server 206, depending upon design considerations. In the depicted example, server 206 provides data such as boot files, operating system images, applications, and application updates to clients 210, 212, and 214, and/or to control device 204. Clients 210, 212, and 214 and control device 204 are clients to server 206 in this example. Network data-processing system 200 may include additional servers, clients, and other devices not shown. Specifically, clients may connect to any member of a network of servers, which provide equivalent content.

In the depicted example, network data-processing system 200 is the Internet with network 202 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers consisting of thousands of commercial, government, educational, and other computer systems that route data and messages. Of course, network data-processing system 200 may also be implemented as a number of different types of networks such as, for example, an intranet, a local area network (LAN), or a wide area network (WAN). FIGS. 1 and 2 are intended as examples and not as architectural limitations for different embodiments of the present invention.

FIG. 3 illustrates a computer software system 300, which may be employed for directing the operation of the data-processing systems such as computer system 100 depicted in FIG. 1. Software application 305, may be stored in memory 104, on removable storage 112, or on non-removable storage 114 shown in FIG. 1, and generally includes and/or is associated with a kernel or operating system 310 and a shell or interface 315. One or more application programs, such as module(s) 125, may be "loaded" (i.e., transferred from removable storage 112 into the memory 104) for execution by the data-processing system 100. The data-processing system 100 can receive user commands and data through user interface 315, which can include input 116 and output 118, accessible by a user 320. These inputs may then be acted upon by the computer system 100 in accordance with instructions from operating system 310 and/or software application 305 and any software module(s) 125 thereof.

Generally, program modules (e.g., module 125) can include, but are not limited to, routines, subroutines, software applications, programs, objects, components, data structures, etc., that perform particular tasks or implement particular abstract data types and instructions. Moreover, those skilled in the art will appreciate that the disclosed method and system may be practiced with other computer system configurations such as, for example, hand-held devices, multi-processor systems, data networks, microprocessor-based or programmable consumer electronics, networked personal computers, minicomputers, mainframe computers, servers, and the like.

Note that the term module as utilized herein may refer to a collection of routines and data structures that perform a particular task or implements a particular abstract data type. Modules may be composed of two parts: an interface, which lists the constants, data types, variable, and routines that can be accessed by other modules or routines; and an implementation, which is typically private (accessible only to that module) and which includes source code that actually implements the routines in the module. The term module may also simply refer to an application such as a computer program designed to assist in the performance of a specific task such as word processing, accounting, inventory management, etc.

The interface 315 (e.g., a graphical user interface 130) can serve to display results, whereupon a user 320 may supply additional inputs or terminate a particular session. In some embodiments, operating system 310 and GUI 130 can be implemented in the context of a "windows" system. It can be appreciated, of course, that other types of systems are possible. For example, rather than a traditional "windows" system, other operation systems such as, for example, a real-time operating system (RTOS) more commonly employed in wireless systems may also be employed with respect to operating system 310 and interface 315. The software application 305 can include, for example, module(s) 125, which can include instructions for carrying out steps or logical operations such as those shown and described herein.

The following description is presented with respect to embodiments of the present invention, which can be embodied in the context of a data-processing system such as computer system 100, in conjunction with program module 125, and data-processing system 200 and network 202 depicted in FIGS. 1-2. The present invention, however, is not limited to any particular application or any particular environment. Instead, those skilled in the art will find that the system and method of the present invention may be advantageously applied to a variety of system and application software including database management systems, word processors, and the like. Moreover, the present invention may be embodied on a variety of different platforms including Macintosh, UNIX, LINUX, LabView, and the like. Therefore, the descriptions of the exemplary embodiments, which follow, are for purposes of illustration and not considered a limitation. Certain systems or methods disclosed herein can be controlled and/or monitored with a computer system.

The methods and systems disclosed herein include embodiments comprising several modules. A first module generally comprises a high-speed driver that includes multiple transistors connected in series. The transistors can be turned on and off simultaneously by identical transistor gate-driver circuits.

The other module can comprise a trigger system. The trigger system can be a photonic trigger system. The photonic trigger system can further comprise a photonic transmitter that includes, a laser, electro-optical modulator, optical splitters, and opto-electronic receivers interconnected with fibers that precisely synchronizes the turn-on and turn-off of each of the series-connected transistors. The combination of features disclosed herein comprises a high-speed driver capable of producing arbitrary pulse patterns that drive, for example, particle beam deflectors. It should be understood that, in other embodiments, the systems and methods can be applied to pulsed power applications, including but not limited to, switching power supplies, power modulators, wireless power transmission, power conversion, etc.

In an embodiment, the methods and systems disclosed herein can simultaneously drive at least two series-connected enhancement mode GaN-on-silicon power transistors by means of microwave photonics techniques. These transistors are arranged into a high voltage and high repetition rate switch that can operate at up to 80 MHz rates. Using multiple transistors in series allows the high switching losses to be shared. The photonic signal distribution system is critical, as it allows precise synchronization between transistors. While the embodiments herein demonstrate 600 V arbitrary pulse generation to a 200 Ohm load with 2 ns rise/fall time, the arbitrary pulse widths can be from 4 ns up.

Figure 4:
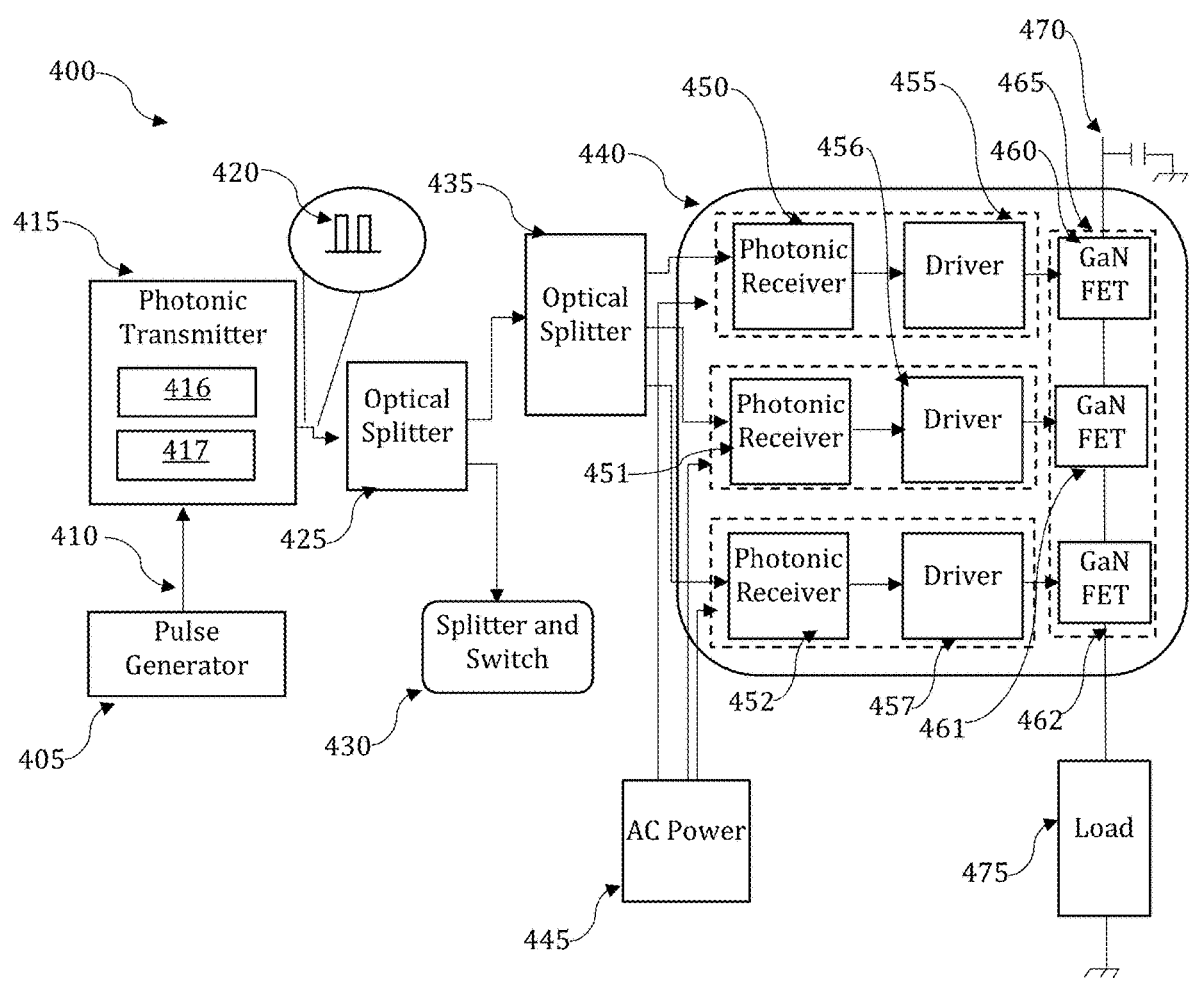
FIG. 4 depicts a block diagram of a high voltage pulse generator system, in accordance with the disclosed embodiments.

FIG. 4 illustrates a block diagram of a system 400 in accordance with the disclosed embodiments. As shown, a pulse generator 405, which can comprise an arbitrary pulse generator, can provide a pulse pattern 410 to a photonic transmitter 415. The photonic transmitter 415, can include a laser 416 and a semiconductor optical (e.g. electro-optical) amplifier/switch (modulator) 417. The photonic transmitter 415 outputs optical pulses 420 to an optical splitter 425, which splits the optical pulses 420. The split output from the optical splitter is sent to a splitter and switch 430, and to a second optical splitter 435 as illustrated.

The second optical splitter 435 provides multiple outputs to a 3-stage switch 440. AC power 445 is provided from a highly isolated AC power source to each stage of the 3-stage switch 440 along with the output from the second optical splitter 435. Each individual output from the optical splitter 435, and AC power 445, is provided to a separate photonic receiver 450-452. The discrete photonic receivers 450-452 in turn provide input to a set of discrete gate-driver circuits. The gate-driver circuits include discrete drivers 455-457. Each driver 455-457 is connected to a separate transistor which can comprise, for example, GaN FETs 460-462. The GaN FETs 460-462 are connected in series and act as a single switch 465. A voltage 470 and load 475 can be connected to the GaN FETs as shown. The load 475 can comprise a component of a particle accelerator, such as a particle beam deflecting device. It should be appreciated that the switch and stages are all entirely isolated from ground.

In certain embodiments, one or more high voltage pulse generators can be housed in a housing with transmission line output provided therein. It should be appreciated that the generators can operate at voltages up to +600V and −600V. This embodiment provides high switching rates both for bursts (e.g., up to 80 MHz) or sustained applications. In addition, the embodiment provides very fast rise time.

Figure 5:
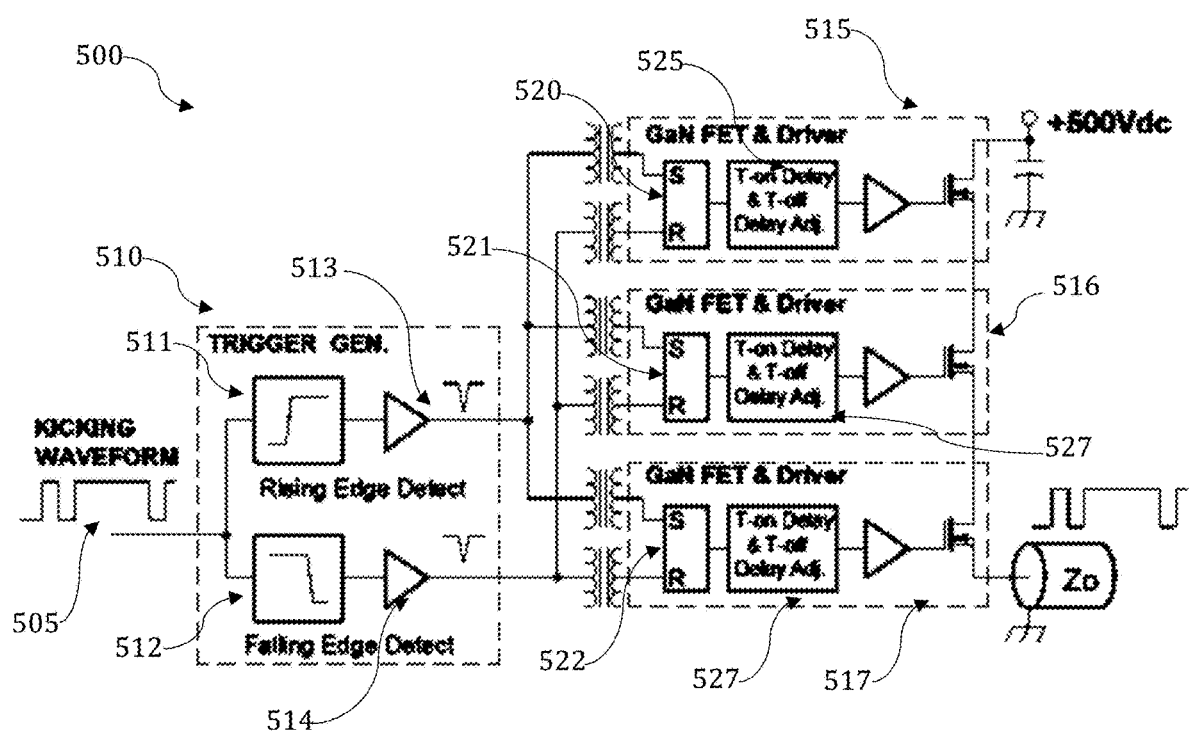
FIG. 5 depicts a block diagram of a chopper driver system, in accordance with the disclosed embodiments.

FIG. 5 illustrates a chopper driver 500 in accordance with another of the disclosed embodiments. It should be appreciated that the chopper driver 500 shown in FIG. 5 illustrates high-side topology, but in other embodiments, low-side topology can also be used. Furthermore, in other embodiments other types of drivers can be used, as further illustrated herein.

In certain embodiments of the chopper driver 500, a kicking waveform 505 can be introduced to a trigger generator 510. The trigger generator 510 includes a rising edge detector 511 and falling edge detector 512, each of which is followed by an amplifier; amplifier 513 for rising edge detector 511, and amplifier 514 for fall edge detector 512.

Each of amplifiers 513-514 associated with the trigger generator 510 provides a separate input to one or multiple GaN FET driver circuits; driver stage 515, driver stage 516 and driver stage 517. It should be appreciated that in FIG. 5, three such stages are shown but a different numbers of driver stages can be used in other embodiments.

The kicking waveform 505 can be reconstructed at each of SR latches 520-522. Specifically, the output from the amplifier 513 can be provided to the set of the SR latches 520-522, and the output from amplifier 514 can be provided to the reset of the SR latches 520-522. The GaN FET Driver stages turn-on and turn-off delay times can be adjusted with delay adjustments 525-527, and can be matched to a selected time. In certain embodiments, this time can be less than 0.1 ns. The GaN FET Driver rise times can thus be matched to less than 0.1 ns.

Figure 6:
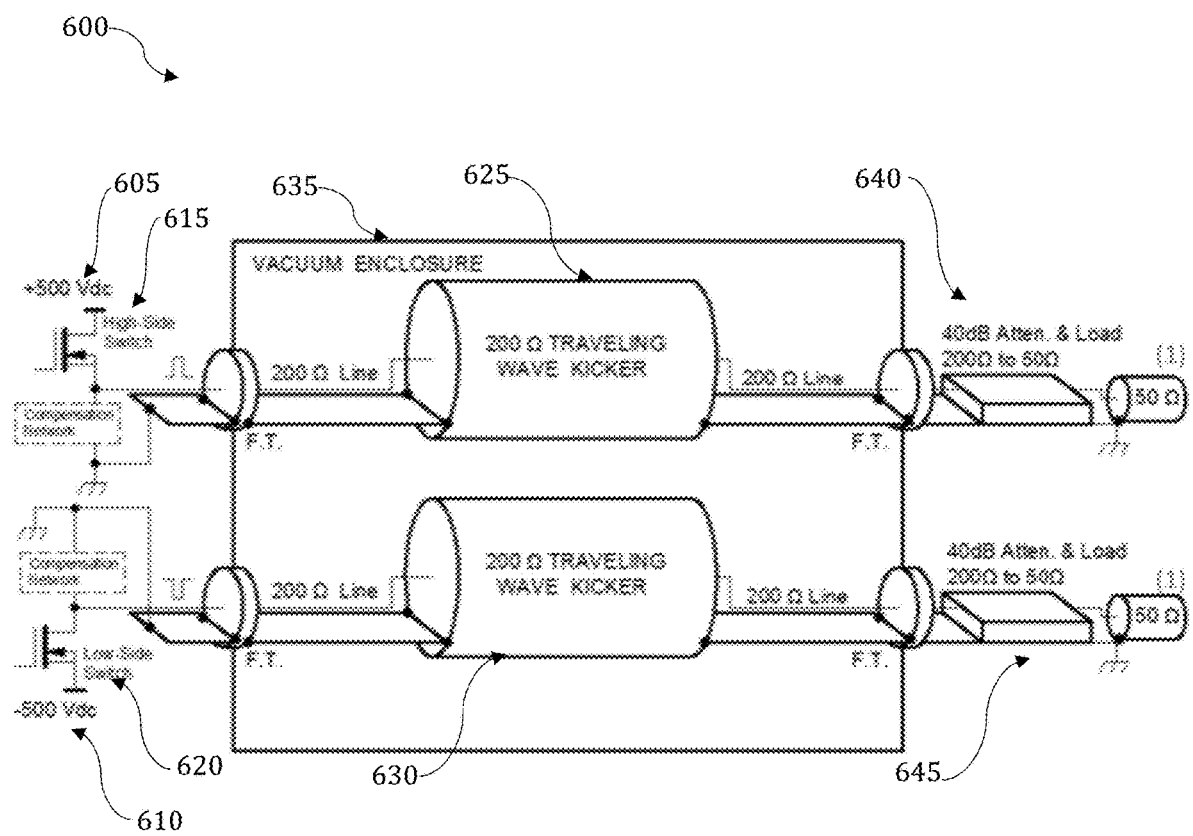
FIG. 6 depicts a chopper driver assembly, in accordance with the disclosed embodiments.

A chopper driver assembly 600 is further detailed in FIG. 6. It should be appreciated that the voltage and resistance values illustrated in FIG. 6 are exemplary and other values can be substituted in alternative embodiments. As illustrated, a high side switch 615 can be connected to a high positive DC voltage source 605, and low side switch 620 can be connected to a high negative DC voltage source 610.

Output from the high side switch 615 is sent to a traveling wave kicker 625 and output from the low side switch 620 is sent to a travelling wave kicker 630. A vacuum enclosure 635 can enclose one or more of the traveling wave kickers 625 and 630. Each of the traveling wave kickers 625 and 630 can comprise a 200 ohm traveling wave kicker, as shown, but other values can be used in other embodiments.

The traveling wave kicker 625 is connected to an attenuator and load 640 and the traveling wave kicker 630 is connected to an attenuator and load 645. Each of the attenuators can comprise a 200 ohm to 50 ohm impedance matching network. Other values can be used according to design considerations.

Figure 7:
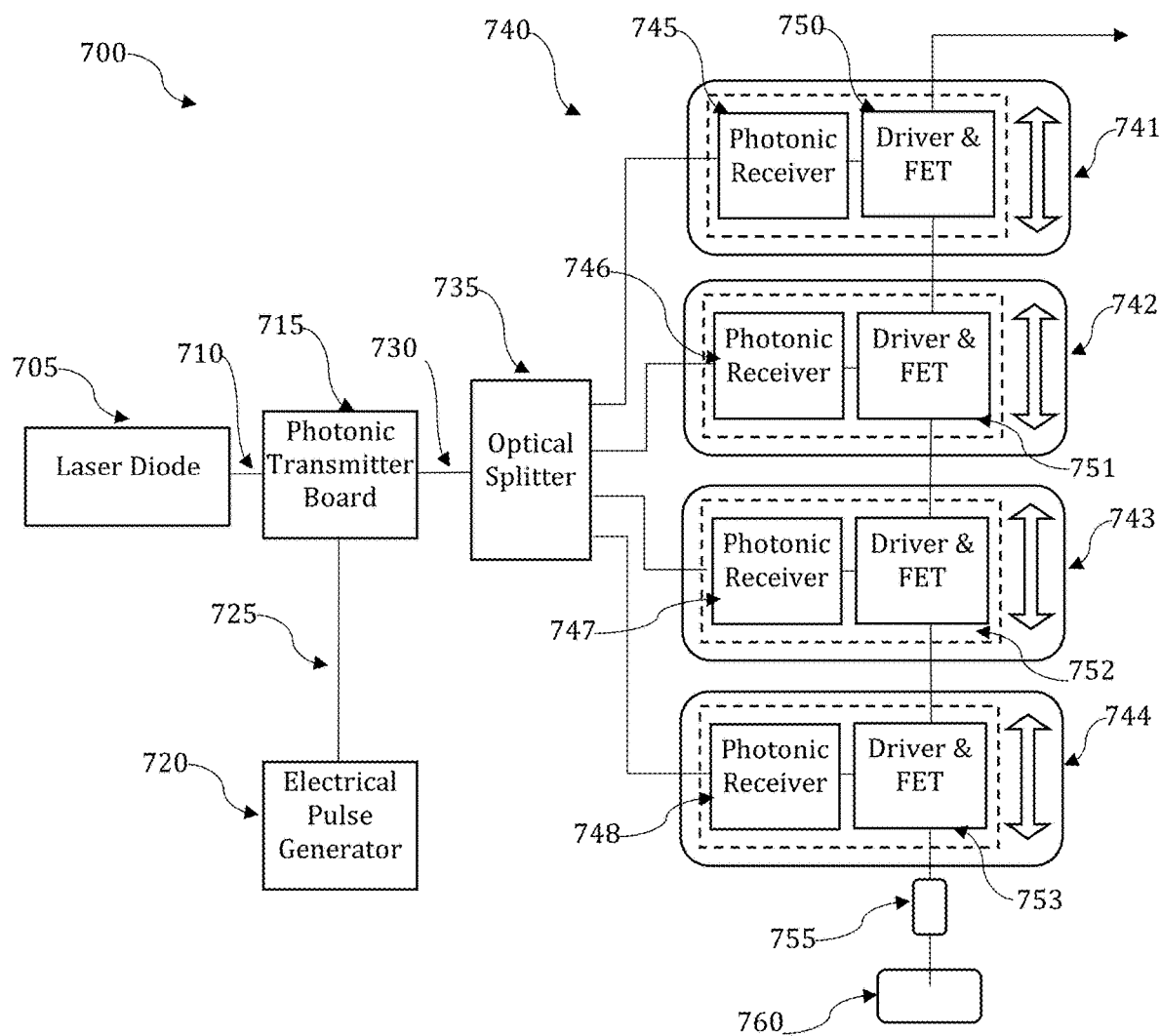
FIG. 7 depicts a block diagram of a system for driving kickers, in accordance with the disclosed embodiments.

FIG. 7 illustrates a block diagram of a system 700, in accordance with another embodiment. The figure includes a number of exemplary values. To that end, other embodiments can include other values according to design consideration. The system 700 includes a laser diode 705 that can provide an incident beam 710 on a photonic transmitter board 715. The photonic transmitter board 715 receives a signal from an electronic pulse generator 720 via a cable 725, such as coax cable.

The photonic transmitter board 715 outputs a signal via, for example fiber optic cable 730, to an optical splitter 735 as further disclosed herein. The optical splitter 735 then provides an input signal to a multiple stage switch 740. Each stage 741-744 of the multiple stage switch 740 receives input from the optical splitter 735 via cable, such as for example fiber optic cable 730.

The multiple stages 741-744 of the multiple stage switch 740 each individually comprise a photonic receiver 745-748 connected to a driver and FET 750-753. Each of the FETs can comprise a GaN FET. The driver is further illustrated herein. The multi stage switch 740 can be connected to a load 755 and voltage 760 as shown. It should be appreciated that the system 700 can be used to drive multiple kickers, simply by adding additional splitters.

Figure 8:
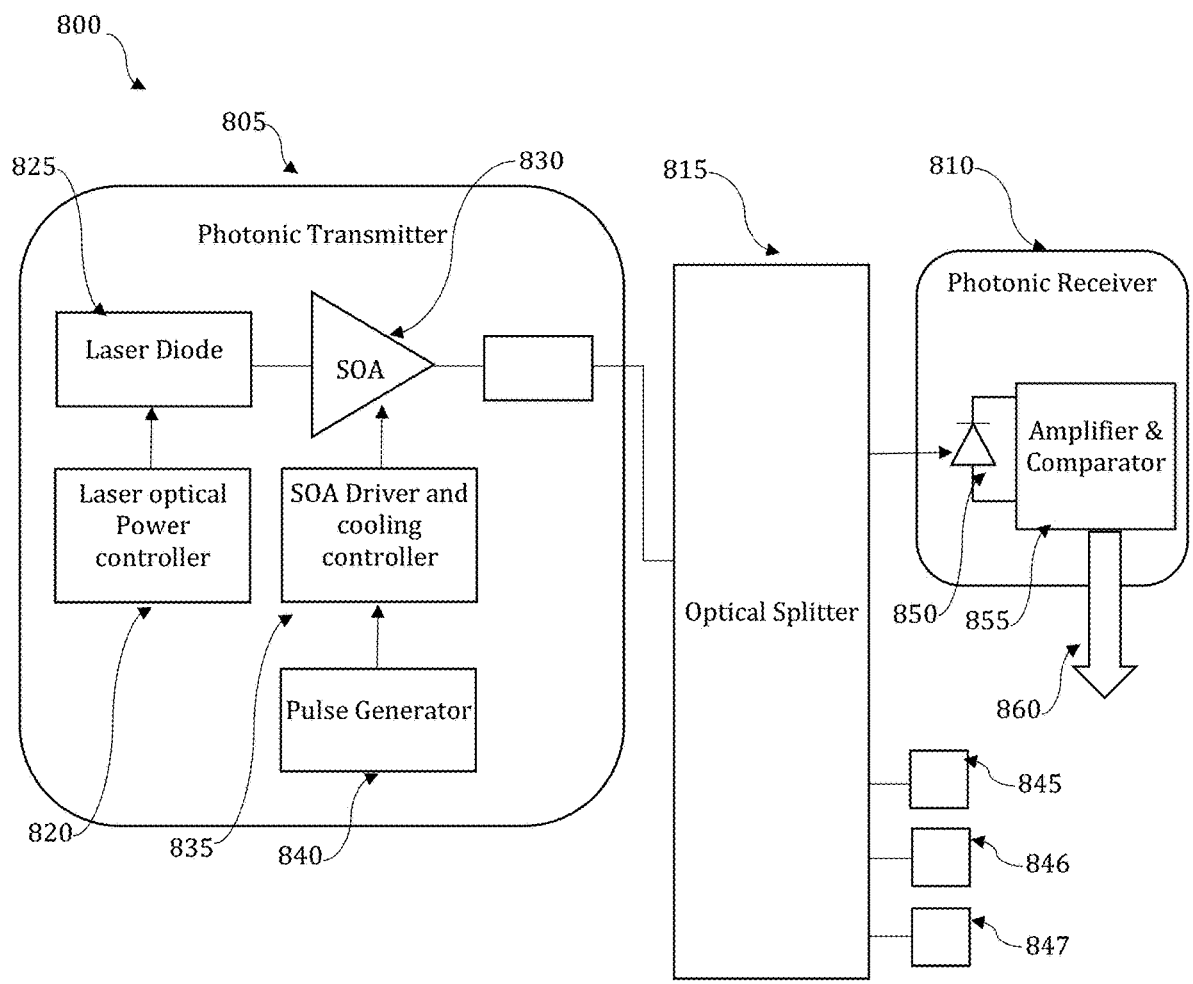
FIG. 8 depicts a block diagram of a pulse generator system that incorporates a laser diode, semiconductor optical amplifier, and pulse generator into a photonic transmitter, in accordance with the disclosed embodiments.

FIG. 8 illustrates another embodiment of a system 800 in accordance with the disclosure herein. The system 800 illustrated in FIG. 8 includes a photonic transmitter 805 and a photonic receiver 810 separated by an optical splitter 815. The photonic transmitter 805 provides an input to the optical splitter 815 which provides one of a plurality of output signals to the photonic receiver 810.

The photonic transmitter 805 includes a laser optical power controller 820 used to control a laser diode 825. The laser diode 825 in turn provides an input signal to a semiconductor optical amplifier 830 (SOA). The SOA 830 can receive wideband electrical pulses from an SOA driver and cooling controller 835, that itself is connected to a pulse generator 840. The SOA 830 can be conceived as an optical shutter, in that it can be turned on and off to produce wideband pulses of light.

Output from the SOA 830 is provided to the optical splitter 815. The optical splitter 815 can split the signal into a plurality of optical pulses. Some of those pulses can be dumped at optical absorbers, such as optical absorber 845, optical absorber 846, and optical absorber 847. One or more of the wideband optical pulses can be delivered via fiber to one (or more) photonic receivers 810. The photonic receiver 810 includes a photodetector 850 connected to an amplifier and comparator module 855 which generates an output 860.

The system of FIG. 8 is noteworthy in that it combines the laser diode 825, SOA 830, and pulse generator 840 into the photonic transmitter 805, as opposed to the embodiments illustrated in FIGS. 4 and 7 which show the laser and generator outside the "photonic transmitter." It is of critical importance to note that the light from the laser 825 is continuous, and electrical pulses from a generator drive the SOA 830 so as to use the amplifier as a switch to turn the light on and off very fast (e.g., in less than 2 nanoseconds).

Figure 9:
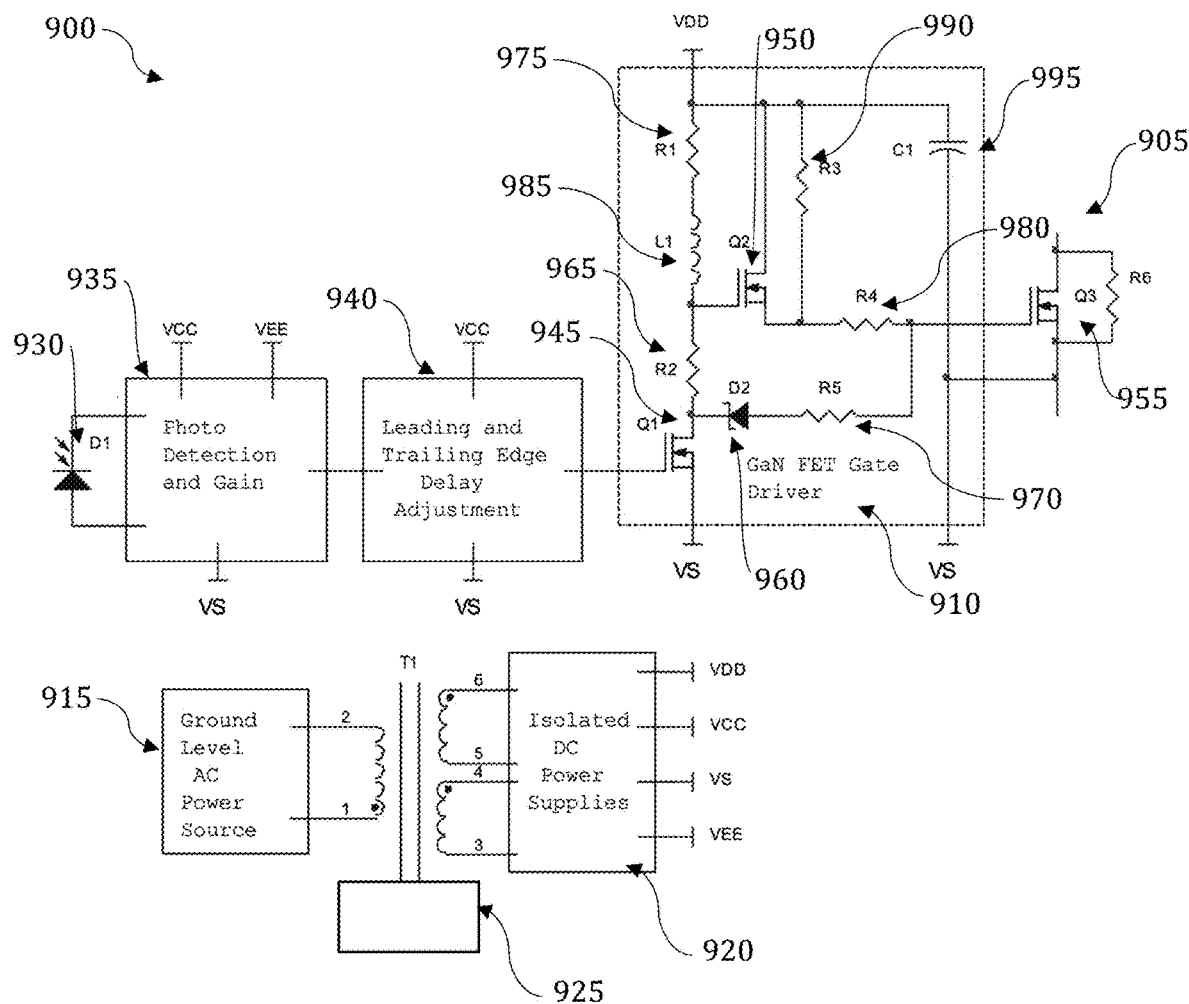
FIG. 9 depicts a block diagram of a transistor stage of a multi-transistor switch, in accordance with the disclosed embodiments.

In an embodiment, a multi-transistor switch driver can be used. FIG. 9 illustrates one transistor stage 900 of a multi-transistor switch. The transistor chosen to construct the multi-transistor switch driver can be a gallium nitride field effect transistor 905 (GaN FET). This transistor can switch at the voltage and turn-on/turn-off switching speed required for the embodiments disclosed herein. Each of the FET transistors require a circuit to drive them on and off individually and simultaneously. Each transistor is powered and controlled by identical circuits that are isolated from the ground. Thus, A single GaN FET 905 along with its gate driver circuit 910 is shown in FIG. 9.

FIG. 9 further illustrates the various components of the GaN FET gate driver circuit. An AC voltage source 915 at the ground level delivers power to transformer T1. This AC voltage is rectified and converted to DC voltage from which three different well-regulated DC voltages are produced in the isolated DC power supplies block 920. Transformer T1 can hold off at least 600 V, deliver more than 2 watts of power to the isolated gate driver circuit 910, and can only present several nano farads of capacitance across the isolation. The capacitance is made low by delivering AC power at, for example, 500 kHz (or other frequency in other embodiments). This is advantageous because it allows the use of a physically small (e.g., an outside diameter of less than an inch, an inside diameter of less than an inch, and a thickness of less than an inch) toroid ferrite core transformer 925. The transformer 925 primary can have as few as two turns, and the secondaries can each have as few as several turns. Minimizing capacitance between each gate driver circuit and ground is necessary for the multi-FET switch assembly to switch completely on and off at the desired timescale (e.g., less than 2 nanoseconds).

The photonics light signal, which is provided as disclosed above, is received by the photo detector D1 930, converted to an electrical signal, and amplified in the photo detection and gain stage 935. High-speed, current feedback operational amplifiers can be used. The photo detector current is converted to voltage in a transimpedance circuit followed by a voltage gain circuit. A high-speed comparator translates this analog signal to a digital logic signal.

The multi-FET switch can be configured such that the reception of light can define the time the GaN FET 905 is on, and no light can define the time the GaN FET 905 is off—or vice versa. The polarity of this operation is set by making a wire connection in the signal gain stage. All FETs comprising a single switch assembly can be configured the same way.

The leading and trailing edge delay adjustment 940 provides a way to adjust timing. Adjustable delay is provided with the use of a potentiometer and fixed capacitance between each of the two high speed CMOS NAND gates to set the leading and trailing edge delays respectively. Two AND gates in parallel buffer the signal out to the next block. Both the turn on and turn off edges can be adjusted and set individually for all the FETs in a switch to be matched to less than, for example, 0.1 nanoseconds. The output of this module has the current drive capability to drive transistor (Q1) 945 in the GaN FET gate driver 910.

Figure 10:
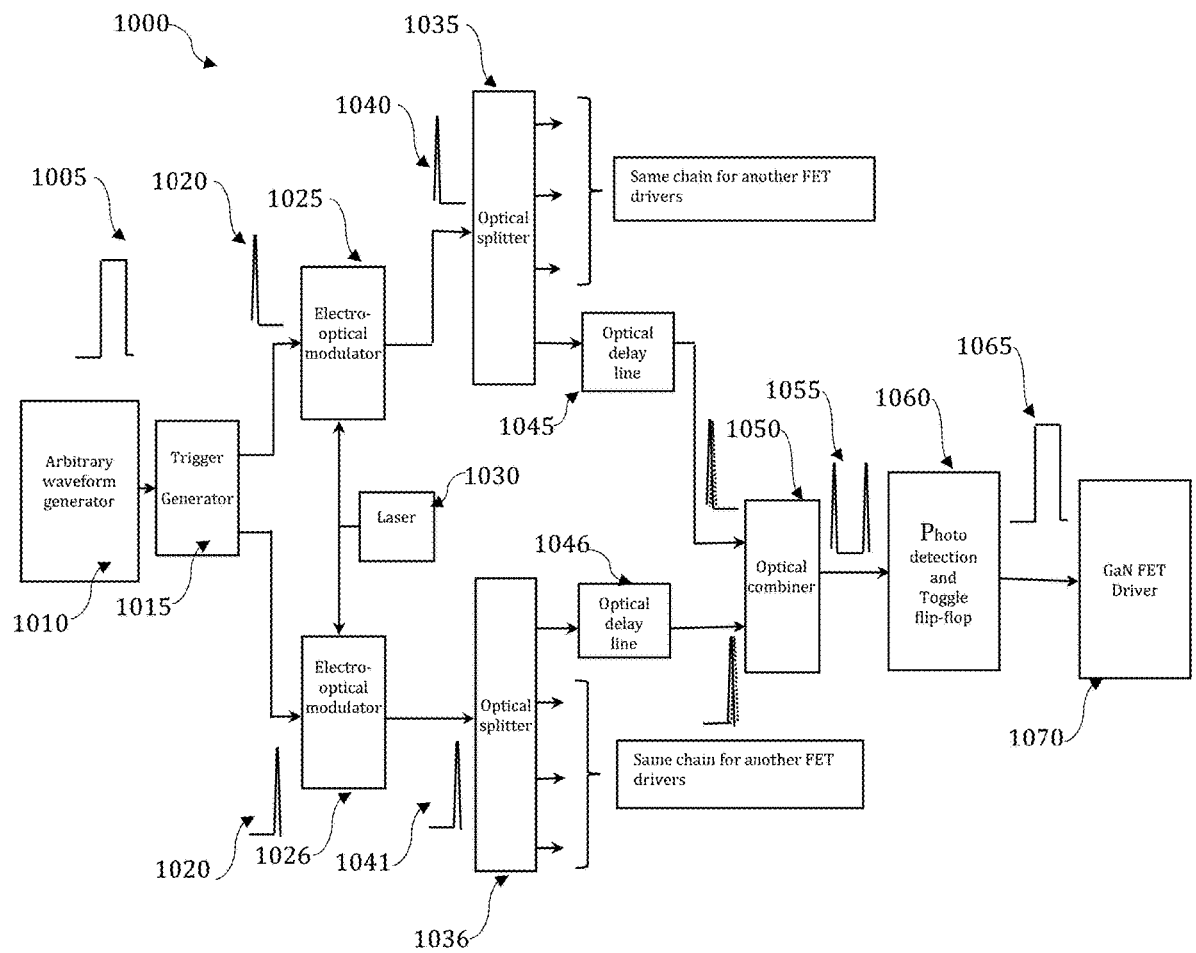
FIG. 10 depicts a block diagram of a photonic trigger system, in accordance with the disclosed embodiments.

In other embodiments, the delay can be achieved in the optical domain using a photonic trigger system 1000 as illustrated in FIG. 10. The system 1000 includes a kicking waveform 1005 provided by the arbitrary waveform generator 1010 and introduced to the trigger generator 1015. The trigger generator 1015 converts the rectangular pulses from the kicking waveform 1005 into a sequence of spikes 1020 that correspond to the rising and trailing edges of the kicking waveform. One trigger generator output is for the rising edge spikes, and a second output is for trailing edge spikes. These outputs drive two separate electro-optical modulators, electro-optical modulator 1025 and electro-optical modulator 1026, powered with the common laser 130. The modulators 1025 and 1026 can be of the Mach-Zehnder interferometer type, a semiconductor optical amplifier, or some other kind of modulator.

Electro-optical modulator 1025 then drives optical splitter 1035, and Electro-optical modulator 1026 drives optical splitter 1036. Each of the optical splitters 1035 and 1036 are driven with short photonic pulses 1040 and 1041 respectively. One splitter gets rising edge pulses, and the other gets trailing edge pulses. In each optical splitter 1035 and 1036, the signal is divided by the number of channels equal to the number of output FETs comprising the switch.

Each channel of the optical splitters 1035 and 1036 is connected to an optical delay line that is used to precisely adjust the rising or trailing edge delay. The optical splitter 1035 is connected to optical delay line 1045 and optical splitter 1036 is connected to optical delay line 1046. The outputs of two separate optical delay lines 1045 and 1046, one for rising edge photonic pulse and another for the trailing edge photonic pulse, are then combined in the optical combiner 1050. The output of the optical combiner 1050 produces a signal which consists of two short photonic pulses 1055. These pulses 1055 are then photo-detected and the original electric kicking waveform 1065 is reconstructed by a toggle flip-flop in the GaN FET driver circuit 1060. This reconstructed waveform 1065 then triggers the GaN FET gate 1070. The rising and trailing edges of the GaN FET gate driver signal can be matched between all the FETs in a switch to less than 10 ps. This approach of putting delay adjustment in the fiber elements gives the GaN FET gate driver circuit better noise immunity than using potentiometers and capacitors within the circuit itself, as may be employed in other embodiments.

No commercial FET gate driver integrated circuit (IC) is currently available that can drive FETs on and off at 80 MHz repetition rates. The circuit comprising the "GaN FET gate driver" is capable of driving FETs on and off at 80 MHz repetition rates. Several design features of the circuit in this module are combined to drive the GaN FET (Q3) 905 on and off in a short (i.e., sub-two nanosecond) time frame and at 80 MHz repetition rates.

It should be appreciated that the 80 MHz rate disclosed herein is a peak rate for bursts lasting for tens of microseconds. 40 MHz is possible for 500 microsecond bursts while 1 MHz average switching rate continuously is achievable, all with modest forced-air cooling. The electrical design of the disclosed embodiments does not limit higher, long burst, and average switching rate operation. However, in other embodiments higher switching rates for other applications may require special thermal design to manage the GaN FET power dissipation. In other such embodiments, tens of megahertz average switching rates are possible with liquid cooling.

The GaN FET gate driver 910 operates as follows. A voltage is applied to the gate of (Q1) 945 to turn it on. Its drain goes low which drives the gates of both (Q2) 950 and GaN FET (Q3) 955 low turning them off. When voltage on the Q1 gate 945 is driven low, its drain rises which raises the voltage on the Q2 gate 950 turning it on. That in turn forces current to flow out of the Q2 source to charge the GaN FET Q3 gate 955 capacitance, turning it on. Diode (D2) 960 is reverse biased when the Q1 drain voltage rises, allowing Q2 950 to turn on by preventing resistor (R2) 965 from being shunted around Q2. Diode (D2) 960 forward biases when Q1 945 turns on and, being a low resistance (forward biased Schottky resistance reduces to a value less than one Ohm, thus a value of about several Ohms is required for resistor (R5) 970 to dampen the voltage ring) allows high current to discharge Q3 955 gate capacitance to turn it off as fast as possible.

There needs to be resistance in series with the Q2 gate 950 when current flows in both directions; that is, current flows into the gate when turning on, and current flows out of the gate when it turns off. Otherwise deleterious ringing occurs due to circuit parasitics. Resistor (R1) 975 damps ringing when Q2 950 turns on. Although, FET damping is generally provided by placing a resistor directly in series with the gate, in certain embodiments of this circuit, resistor R2 965 not only damps ringing when Q2 950 turns off, but also reduces current through R1 975 when Q1 945 turns on thereby reducing power dissipated in R1 975. Also, R2 965 is small enough (e.g., on the order of 10 Ohms, or other resistances in other embodiments) that voltage across it does not prevent Q2 950 from turning off when it should. It should be noted that the circuit includes resistor (R3) 990 and capacitor (C1) 995.

Several factors contribute to the novel and power-efficient embodiments of the GaN FET driver circuit and switching speed. One is that Q1 and Q2 are uniquely chosen. Specifically, they are GaN FETs that have very fast switching speed, are physically very small, have low gate to source, and drain to source, capacitance in relation to their drain current rating, and their turn-on threshold voltage is lower than any other type of FET. In certain embodiment, it should be appreciated that it is necessary that the turn on and off transition times of these transistors be one nanosecond or less.

In certain embodiments, transistors Q1 and Q2 can be approximately 2 millimeters square in size. That allows them to be physically located very close to together and close to the Q3 gate. This minimizes the parasitic inductance along the current path through Q3 gate allowing resistor (R4) 980 and R5 970 resistor values to be low enough to damp voltage ringing and enable the Q3 955 gate to transition on and off fast.

The low capacitance values of Q1 945 and Q2 950 provides the desired switching speed in several ways. The digital logic IC driving the gate of Q1 945, although having limited output drive current capability, can turn Q1 945 on and off in one nanosecond, because the Q1 945 gate capacitance is low. Also, a novel use of inductor (L1) 985 in series with R1 975 forms a two-pole network in combination with the sum of Q1 945 drain and Q2 950 gate capacitances. This network results in turning on Q2 950 with the speed as if a smaller value of R1 975 was used instead with L1 985 omitted. The resulting larger value of R1 975 reduces its power dissipation by about 30% compared with using a smaller R1 value without L1 985. The values of R1 975 and L1 985 are chosen for the two-pole network to be somewhat underdamped that results in the gate Q2 950 voltage to overshoot positive at turn on. However, because the Q1 945 and Q2 950 capacitances are as low as they are, the network's natural resonant frequency is high enough that the voltage settles back in time to not cause timing shifts if a turn on cycle occurs every 12 nanoseconds. This allows the multi-switch to achieve 80 MHz repetition switching rates (for example).

The embodiments illustrated herein thus provide a driving circuit for pulsed voltage power supplies. The embodiments are, for example, used for operating travelling wave kickers, which are used in particle accelerators for giving a kick to the selected bunch in a particle beam. The embodiments can deliver, fast high voltage waveforms, often to low impedance structures.

The embodiments essentially convert input electrical signals into light and deliver the light to a series of FET drivers. The light is provided with a laser, and a switch embodied as an electro-optical modulator can be used to split the modulated optical beam into a plurality of beams that are detected with a photodetector.

Figure 11:
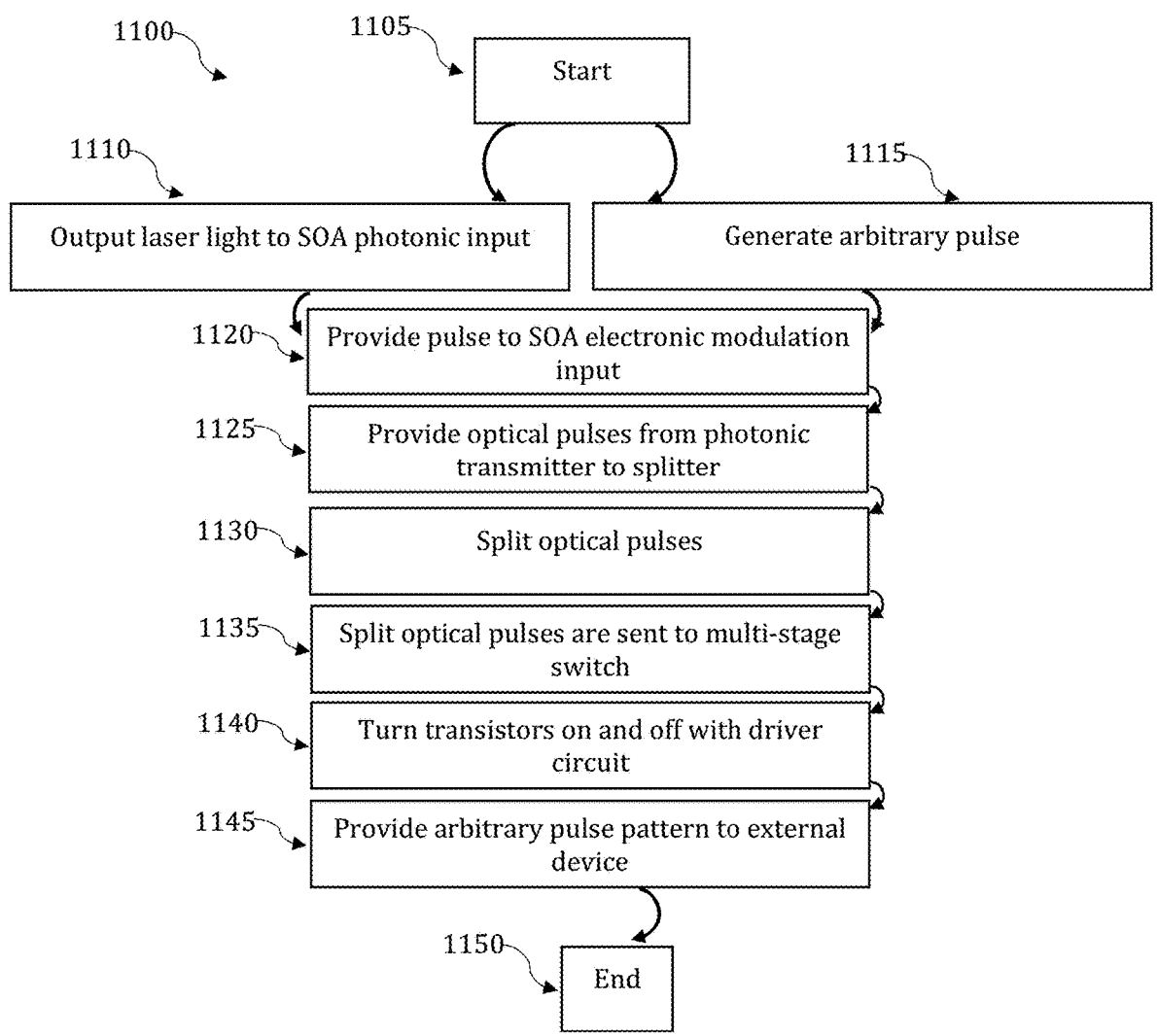
FIG. 11 depicts a flow chart of steps associated with a method for generating a high voltage pulse, in accordance with the disclosed embodiments.

FIG. 11 illustrates a method 1100 for producing arbitrary pulse patterns that CAN drive systems including, but not limited to, particle beam deflectors. The method starts 1105. At step 1115 an arbitrary pulse can be generated with a pulse generator. In a simultaneous, or substantially simultaneous step, laser light can be output to an SOA photonic unit as shown at step 1110. The pulse can then be provided to the SOA which serves as an electronic modulation unit, as illustrated at 1120. The photonic transmitter outputs optical pulses to an optical splitter as shown at 1125, which splits the optical pulses, as illustrated at 1130.

At step 1135, the split optical pulses can be output to a multi-stage switch. AC power can be provided from a highly isolated AC power source, to the multi-stage switch. The multi-stage switch comprises multiple transistors connected in series, wherein the transistors can be turned on and off simultaneously by identical transistor gate-driver circuits as illustrated at step 1140. Each driver is connected to a separate GaN FET. The FETs are connected in series and act as a single switch. The output thus provides a high-speed driver capable of producing arbitrary pulse patterns that can drive an external device such as, for example, particle beam deflectors, as shown at 1145. The method ends at 1150.

An exemplary application of the disclosed embodiments has been tested in association with an accelerator application. The performance of the embodiments in a particle beam deflector application is provided in FIGS. 12-14.

Figure 12:
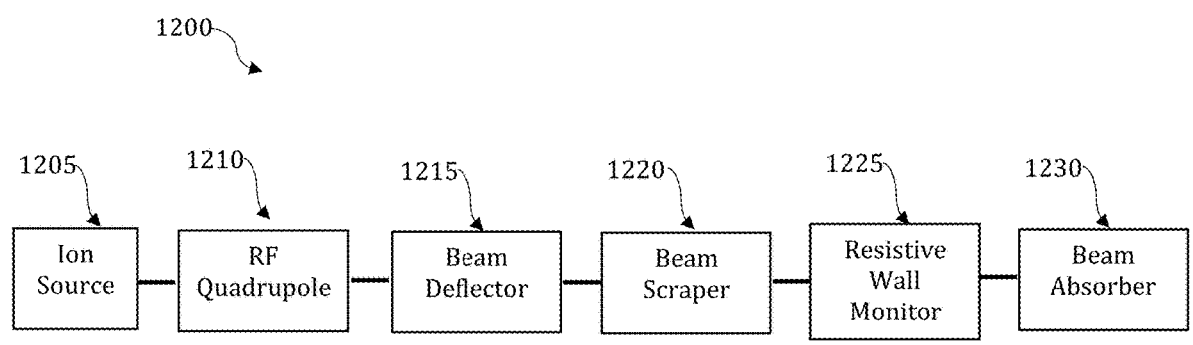
FIG. 12 depicts a block diagram of an exemplary system setup, in accordance with the disclosed embodiments.

A block diagram of an exemplary system 1200 setup is illustrated FIG. 12. The exemplary system 1200 includes an ion source 1205 connected to radio-frequency quadrupole (RFQ) 1210. The RF Quadrapole 1210 provides output to beam deflector 1215 and beam scraper 1220. A resistive wall monitor 1225 is used for monitoring and the beam is absorbed with a beam absorber 1230.

In an exemplary embodiments, the beam deflector 1215 can comprise two travelling wave structures that are used to slow down the electromagnetic wave propagation velocity to match the beam velocity. It should be understood that the values associated with the exemplary embodiment are also exemplary and other values can be achieved in accordance with aspects of the disclosed embodiments. These structures can be driven separately, each with its own driver. In an exemplary setup, the bunch length can be approximately 1.3 ns, and the beam can bunched at 6.15 ns intervals. The exemplary setup can kick out a beam on a bunch-by-bunch basis. Thus, the beam deflector and its driver have a rise/fall time of 2 ns and a minimum pulse width of 4 ns. This is necessary to ensure the system can turn on and off completely in between the bunches. Voltages can be generated on and off to kick and pass bunches having pulse widths that can be from 4 ns to essentially DC. Any arbitrary pulse pattern can be generated and therefore any beam structure can be achieved.

In certain embodiments, the system illustrated in FIG. 12 can operate as follows. An H-beam can be generated in the ion source 1205. The H-beam can have an exemplary energy of 30 keV (or other desired energy) as it enters the radio frequency quadrupole 1210 (RFQ). While travelling through the RFQ 1210, the beam is grouped into (for example) a 162.5 MHz bunch structure and accelerated to an energy of 2.1 MeV. Then the bunched beam enters the beam deflector 1215, where only the desired bunches of the beam are deflected off the central axis. In the beam deflector 1215, the beam separates into two beams: the deflected beam and passed beam. While travelling downstream, the deflected beam is stopped with the beam scraper 1220 which can be moved into the beamline such that it scrapes the deflected beam bunches, terminating their transmission but does nothing to the passed beam. The passed beam therefore goes further, enters the wall current monitor 1225, and then is absorbed in the beam absorber 1230. The wall current monitor 1225 allows observation and measurement of the beam time structure.

Figure 13:
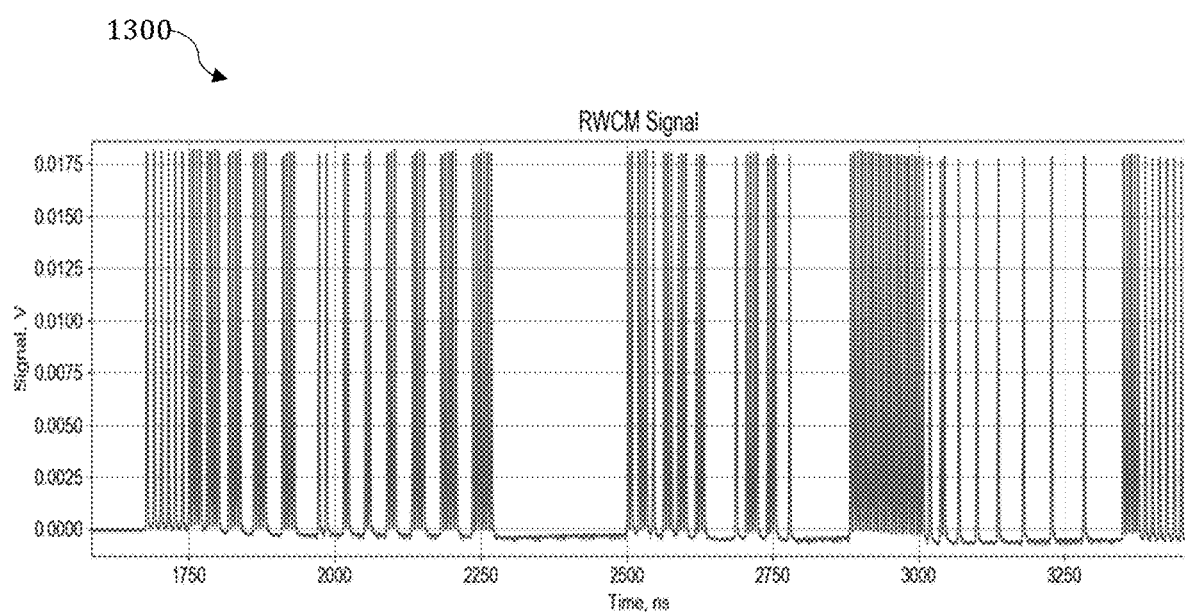
FIG. 13 depicts an exemplary chart of bunch by bunch kicking according to the systems and methods disclosed herein, in accordance with the disclosed embodiments.

An example of such arbitrary bunch-by-bunch kicking provided by the exemplary setup was recorded during testing and is shown in chart 1300 in FIG. 13. Demonstrations of the driver switching at 81 MHz at 500 V can be seen between 1600 ns and 1750 ns, between 1950 ns and 2000 ns, and after 3400 ns to the end.

Based on the foregoing, it can be appreciated that a number of embodiments, preferred and alternative, are disclosed herein. For example, in an embodiment a driver system comprises a trigger and a multi-stage switch comprising a plurality of stages, wherein the stages are triggered by the trigger.

In an embodiment, the trigger further comprises a pulse generator and a trigger generator. The trigger can further comprise photonic transmitter. In an embodiment, the photonic transmitter further comprises a laser and an electro-optical modulator. In an embodiment the trigger further comprises at least one optical splitter. In an embodiment the system further comprises a plurality of photonic receivers wherein each output of the optical splitter is received by one of the plurality of photonic receivers.

In an embodiment of the system, each of the plurality of stages comprises a transistor and a driver for each transistor wherein each of the transistors is turned on and off simultaneously by the associated driver.

In an embodiment, the driver system further comprises an SR latch wherein one of the two modified pulse patterns is input to a set of the SR latch, and one of the two modified pulse patters is input to a reset of the SR latch.

In another embodiment, a driver apparatus comprises a trigger, the trigger comprising a pulse generator and a trigger generator and a multi-stage switch comprising a plurality of stages connected in series, each of the stages comprising: a transistor and a driver for each transistor wherein each of the transistors is turned on and off simultaneously by the associated driver.

In an embodiment, the trigger generator comprises a photonic transmitter, the photonic transmitter further comprising: a laser, an electro-optical modulator, and an optical splitter.

In an embodiment, the apparatus further comprises a plurality of photonic receivers wherein each output of the optical splitter is received by one of the plurality of the receivers.

In an embodiment, of the apparatus the trigger generator accepts an input pulse pattern, splits the input pulse pattern, and provides two modified pulse patterns to each of the stages.

In an embodiment, the apparatus further comprises an SR latch wherein one of the two modified pulse patterns is input to a set of the SR latch, and one of the two modified pulse patters is input to a reset of the SR latch.

In an embodiment, the driver apparatus further comprises an AC power source connected to each of the plurality of stages.

In an embodiment, the driver apparatus further comprises a load wherein the multi-stage switch provides a voltage to the load.

In yet another embodiment, a method for generating a pulse comprises providing a pulse pattern as input a trigger generator, splitting the pulse pattern into a plurality of pulses, delivering one of the plurality pulses to each stage in a multi-stage switch, and driving a transistor associated with each stage with the plurality of pulses wherein the transistors associated with each stage are turned on and off simultaneously.

In an embodiment, the method further comprises providing laser light from a laser associated with the trigger generator and modulating the laser light with the pulse pattern.

In an embodiment, the method further comprises isolating each stage in the multistage switch. Fiber optic connection can be provided to each of the stages. In an embodiment the method further comprises receiving input at each of the stages with a photo detector.

In an embodiment, the method additionally includes adjusting a turn-on delay time and a turn-off delay time for each stage in the multi-stage switch.

It will be appreciated that variations of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art which are also intended to be encompassed by the following claims.

What is claimed is:

1. A driver system comprising:
   a trigger comprising a photonic transmitter, said photonic transmitter further comprising:
      a laser;
      an electro-optical modulator; and
      an optical splitter;
   a plurality of photonic receivers wherein each output of said optical splitter is received by one of said plurality of photonic receivers; and
   a multi-stage switch comprising a plurality of stages, each of said plurality of stages comprising:
      a transistor; and
      a driver for each transistor;
   wherein said plurality of stages are triggered by said trigger.

2. The driver system of claim 1 wherein said trigger further comprises:
   a pulse generator; and
   a trigger generator.

3. The driver system of claim 2 wherein said trigger generator accepts an input pulse pattern, splits said input pulse pattern, and provides two modified pulse patterns to each of said plurality of stages.

4. The driver system of claim 1 wherein each of said plurality of stages comprises:
   a transistor; and
   a driver for each transistor;
   wherein each of said transistors is turned on and off simultaneously by said associated driver.

5. The driver system of claim 3 further comprising:
   an SR latch wherein one of said two modified pulse patterns is input to a set of said SR latch, and one of said two modified pulse patterns is input to a reset of said SR latch.

6. A driver apparatus comprising:
a trigger, said trigger comprising a pulse generator and a trigger generator wherein said trigger generator comprises a photonic transmitter, said photonic transmitter further comprising:
a laser;
an electro-optical modulator; and
an optical splitter; and
a multi-stage switch comprising a plurality of stages connected in series, each of said plurality of stages comprising:
a transistor; and
a driver for each transistor;
wherein each of said transistors is turned on and off simultaneously by said associated driver.

7. The driver apparatus of claim 6 further comprising:
a plurality of photonic receivers wherein each output of said optical splitter is received by one of said plurality of photonic receivers.

8. The driver apparatus of claim 6 wherein said trigger generator accepts an input pulse pattern, splits said input pulse pattern, and provides two modified pulse patterns to each of said plurality of stages.

9. The driver apparatus of claim 8 further comprising:
an SR latch wherein one of said two modified pulse patterns is input to a set of said SR latch, and one of said two modified pulse patterns is input to a reset of said SR latch.

10. The driver apparatus of claim 6 further comprising:
an isolated AC power source connected to each of said plurality of stages.

11. The driver apparatus of claim 6 further comprising:
a load wherein said multi-stage switch provides a voltage to said load.

12. A method for generating a pulse comprising:
providing a pulse pattern as input to a trigger generator;
providing laser light from a laser associated with said trigger generator;
modulating said laser light with said pulse pattern;
splitting said pulse pattern into a plurality of pulses;
delivering one of said plurality of pulses to each stage in a multi-stage switch; and
driving a transistor associated with each stage with said plurality of pulses wherein said transistors associated with each stage are turned on and off simultaneously.

13. The method of claim 12 further comprising:
isolating each stage in said multi-stage switch.

14. The method of claim 12 further comprising:
receiving input at each of said stages with a photo detector.

15. The method of claim 12 further comprising:
adjusting a turn-on delay time and a turn-off delay time for each stage in said multi-stage switch.

* * * * *